(12) United States Patent
Tanaka

(10) Patent No.: US 9,093,698 B2
(45) Date of Patent: Jul. 28, 2015

(54) FUEL CELL STACK CASING

(75) Inventor: Hideyuki Tanaka, Kariya (JP)

(73) Assignee: TOYOTA JIDOSHA KABUSHIKI KAISHA, Toyota-Shi (JP)

( * ) Notice: Subject to any disclaimer, the term of this patent is extended or adjusted under 35 U.S.C. 154(b) by 1313 days.

(21) Appl. No.: 11/992,551

(22) PCT Filed: Oct. 20, 2006

(86) PCT No.: PCT/JP2006/320907
§ 371 (c)(1),
(2), (4) Date: Mar. 25, 2008

(87) PCT Pub. No.: WO2007/046490
PCT Pub. Date: Apr. 26, 2007

(65) Prior Publication Data
US 2009/0130530 A1    May 21, 2009

(30) Foreign Application Priority Data
Oct. 20, 2005  (JP) ................. 2005-305583

(51) Int. Cl.
*H01M 8/04* (2006.01)
*H01M 2/02* (2006.01)
*H01M 8/24* (2006.01)
*H01M 8/10* (2006.01)

(52) U.S. Cl.
CPC .......... *H01M 8/2475* (2013.01); *H01M 8/2405* (2013.01); *H01M 2008/1095* (2013.01); *H01M 2250/20* (2013.01); *Y02E 60/50* (2013.01); *Y02T 90/32* (2013.01)

(58) Field of Classification Search
CPC .................................................. H01M 8/2475
USPC ............ 257/678, 687, 700, 712, 729, E23.08, 257/E23.101, E23.102, E23.104; 338/57, 338/230, 258, 262; 361/142, 600, 679.02, 361/687, 713; 429/34, 35, 36, 37, 400, 429/507–511
See application file for complete search history.

(56) References Cited

U.S. PATENT DOCUMENTS 3,561,639 A * 2/1971 Allen ........................... 220/88.1
5,473,110 A * 12/1995 Johnson ........................ 174/353
(Continued)

FOREIGN PATENT DOCUMENTS

JP         06-077687 A      3/1994
JP         2002-319381 A   10/2002
(Continued)

*Primary Examiner* — Carlos Barcena
(74) *Attorney, Agent, or Firm* — Kenyon & Kenyon LLP

(57) ABSTRACT

A fuel cell stack casing for housing a fuel cell stack. The fuel cell stack casing may include a resin and an electromagnetic wave damping material, for example, a conductive material. In addition, the fuel cell stack may be electromagnetically shielded by the electromagnetic wave damping material. The fuel cell stack casing may include a plurality of members coupled to each other such that conductive materials contained in the members are electrically connected to each other. An inside surface of the casing may be an insulating surface. A plurality of apertures for ventilation may be formed in a wall of the casing such that the apertures are spaced from each other. The apertures may be covered with a cover.

4 Claims, 5 Drawing Sheets

(56) References Cited

U.S. PATENT DOCUMENTS

| | | | |
|---|---|---|---|
| 5,717,160 A * | 2/1998 | Bootle | 174/384 |
| 5,782,546 A * | 7/1998 | Iwatare | 312/236 |
| 6,653,008 B1 * | 11/2003 | Hirakata et al. | 429/434 |
| 2002/0071940 A1 * | 6/2002 | Arnold et al. | 428/195 |
| 2003/0039878 A1 | 2/2003 | Miyakoshi et al. | |
| 2004/0037042 A1 * | 2/2004 | Hockanson et al. | 361/704 |
| 2004/0161654 A1 * | 8/2004 | DeVries | 429/34 |
| 2005/0202309 A1 | 9/2005 | Nakagawa et al. | |
| 2005/0214619 A1 | 9/2005 | Fujiwara et al. | |
| 2005/0282059 A1 * | 12/2005 | Yanagisawa | 429/34 |

FOREIGN PATENT DOCUMENTS

| | | | |
|---|---|---|---|
| JP | 2002-362164 A | 12/2002 | |
| JP | 2002-367652 A | 12/2002 | |
| JP | 2003-115312 A | 4/2003 | |
| JP | 2004-319277 A | 11/2004 | |
| JP | 2005-259360 A | 9/2005 | |
| JP | 2005-285405 A | 10/2005 | |
| JP | 2006-086070 A | 3/2006 | |
| JP | 2006-216403 A | 8/2006 | |
| JP | 2007-005198 A | 1/2007 | |
| WO | WO 02/11222 A1 | 2/2002 | |
| WO | WO 2007015142 A1 * | 2/2007 | H01M 8/24 |

* cited by examiner

FUEL CELL STACK CASING

CROSS-REFERENCE TO RELATED APPLICATIONS

This is a 371 national phase application of PCT/JP2006/320907 filed 20 Oct. 2006, which claims priority of Japanese Patent Application No. 2005-305583 filed 20 Oct. 2005, the contents of which are incorporated herein by reference.

TECHNICAL FIELD

The present invention relates to a fuel cell stack casing for housing a fuel cell stack.

BACKGROUND

A fuel cell includes separators and an MEA disposed between the separators. A plurality of fuel cells layers form a fuel cell stack. The fuel cell stack is housed in the fuel cell stack casing.

Conventional fuel cell stacks may be made of materials such as aluminum or iron, as disclosed in, for example, Japanese Patent Publication 2002-362164, the entire contents of which are hereby incorporated by reference. However, there are the following problems with conventional fuel cell stack casings: (i) because metal is used, the weight of the casings may be large; (ii) in a case where a ventilation aperture is provided, the casing size is determined so that a necessary ventilation may be obtained, thus a electromagnetic shield may be decreased, and as a result, an electromagnetic wave may pass through the aperture; and (iii) certain materials may cause the rigidity of the casing to be decreased.

BRIEF SUMMARY

An object of certain embodiments of the present invention is to provide a fuel cell stack casing capable of solving at least one of the above-described (e.g., (i), (ii) and (iii)) problems, that is, capable of achieving at least one of lightening the casing and/or assuring an electromagnetic shield of the casing. The fuel cell stack casing according to certain embodiments of the present invention for solving the above problems and achieving the above object is as follows:

(1) A fuel cell stack casing housing a fuel cell stack therein, wherein material of the fuel cell stack casing may include resin and electromagnetic wave damping material for damping an electromagnetic wave.

(2) A fuel cell stack casing according to item (1) above, wherein an electromagnetic wave damping material content per a unit volume of the material of the fuel cell stack casing may be higher than a resin content per the unit volume of the material of the fuel cell stack casing.

(3) A fuel cell stack casing according to item (1) or (2) above, wherein the electromagnetic wave damping material may include a fluid permeability in a thickness direction of a wall of the fuel cell stack casing, and a fluid non-permeability in a thickness direction of a wall of the fuel cell stack casing may be given to the fuel cell stack casing by the resin.

(4) A fuel cell stack casing according to any one of items (1) to (3) above, wherein a corrosion resistance of the electromagnetic wave damping material may be higher than a corrosion resistance of the resin.

(5) A fuel cell stack casing according to any one of items (1) to (4) above, wherein the fuel cell stack casing may be installed on a vehicle. The electromagnetic wave damping material may be a conductive material. The conductive material may be attached to a vehicle body.

(6) A fuel cell stack casing according to any one of items (1) to (5) above, wherein the electromagnetic wave damping material may be a conductive material and the fuel cell stack casing may include a plurality of members. The plurality of members may be coupled to each other such that conductive materials included in the plurality of members may be caused to be conductive with each other.

(7) A fuel cell stack casing according to any one of items (1) to (6) above, wherein the fuel cell stack casing may include an insulated inside surface.

(8) A fuel cell stack casing according to any one of items (1) to (7) above, wherein the fuel cell stack casing may have a plurality of apertures for allowing air to pass therethrough formed in a wall of the fuel cell stack casing and spaced from each other.

(9) A fuel cell stack casing according to item (8) above, wherein each of the apertures formed in the wall of the fuel cell stack casing may have a grommet coupled to a hem of the aperture. The grommet may be made from either any suitable material such as, for example, resin or rubber.

(10) A fuel cell stack casing according to item (8) or (9) above, wherein each of the apertures may have a size smaller than a size at which the electromagnetic shield is maintained irrespective of existence of each of the apertures.

(11) A fuel cell stack casing according to any one of items (8) to (10) above, wherein the plurality of apertures may be covered by a cover made from a material which allows air to pass therethrough and may not allow water to pass therethrough.

According to the fuel cell stack casing according to items (1) to (5) above, since the fuel cell stack casing may be made from material including resin and electromagnetic wave damping material, the fuel cell stack casing can be made lighter due to the resin, and an electromagnetic shield can be given to the fuel cell stack casing due to the electromagnetic wave damping material.

According to the fuel cell stack casing according to item (6) above, since the fuel cell stack casing may include a plurality of members (e.g., an upper casing and a lower casing of an embodiment described hereinafter), and the plurality of the members may be coupled to each other such that conductive materials included in the plurality of members may be caused to be conductive to each other, electromagnetic waves may be prevented from leaking at a coupling portion of the plurality of the casings.

According to the fuel cell stack casing according to item (7) above, since the fuel cell stack casing may include an insulated inside surface, the casing may be electrically insulated from high voltage parts housed in the casing. As a result, problems relating to contacting the casing may be limited and/or prevented.

According to the fuel cell stack casing according to item (8) above, since the fuel cell stack casing may have a plurality of apertures for allowing air to pass therethrough formed in a wall of the fuel cell stack casing and spaced from each other, even if a very small amount of fuel gas leaks from the fuel cell, an interior of the fuel cell stack casing can be ventilated. Further, since the plurality of apertures are spaced from each other, electromagnetic waves may be prevented from passing through the apertures so that electromagnetic shield may be maintained, unlike a case where a single, large aperture is provided and electromagnetic waves pass through the large aperture.

According to the fuel cell stack casing according to item (9) above, since each of the apertures may be formed in the wall of the fuel cell stack casing having a grommet made from either one of resin and rubber, coupled to a hem of the aperture, even if a wire harness contacts the grommet, the wire harness is unlikely to be injured. If the grommet is not provided and the wire harness contacts a corner of the hem of the aperture, the wire harness may be injured, and as a result, a core wire may be exposed to electrically contact the casing.

According to the fuel cell stack casing according to item (10) above, since each of the apertures may have a size smaller than a size at which electromagnetic shield is maintained (e.g., smaller than an aperture of a about 40 mm in diameter), leakage of electromagnetic wave may be limited and/or prevented when the apertures are used as ventilation apertures.

According to the fuel cell stack casing according to item (11) above, since the plurality of apertures may be covered by a cover made from a material which allows air to pass therethrough and does not allow water to pass therethrough, water can be prevented from entering the casing without losing a ventilating ability of the casing. When providing the cover, by providing a conductive material in the material of the cover and by conducting the conductive material of the cover to the casing, the electromagnetic shield may be maintained even if a size of each of the apertures is made large.

The invention may be embodied by numerous methods, systems, devices, and products, and the description and drawings provided herein are examples of the invention. Other embodiments, which incorporate some or all of the steps and features, are also possible.

BRIEF DESCRIPTION OF THE DRAWINGS

Referring to the drawings, which form a part of this disclosure.

DETAILED DESCRIPTION

A fuel cell stack casing according to certain embodiments of the present invention will be explained with reference to FIGS. 1-19.

Figure 3:
FIG. 3 is a cross-sectional view of a wall of the fuel cell stack casing according to embodiment 1 of the present invention.
Figure 4:
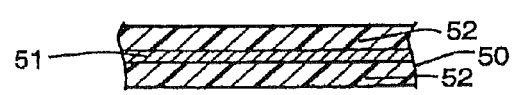
FIG. 4 is a cross-sectional view of a wall of the fuel cell stack casing according to embodiment 2 of the present invention.
Figure 5:
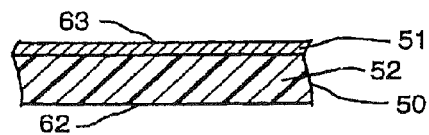
FIG. 5 is a cross-sectional view of a wall of the fuel cell stack casing according to embodiment 3 of the present invention.
Figure 6:
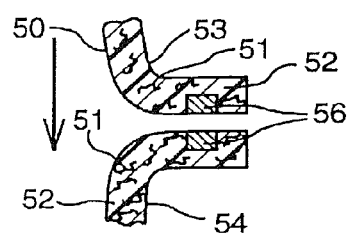
FIG. 6 is a cross-sectional view of a flange portion (a flange portion of a connecting portion of an upper casing and lower casing) of the fuel cell stack casing according to embodiment 4 of the present invention.
Figure 7:
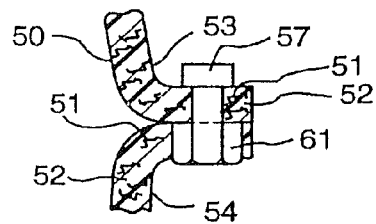
FIG. 7 is a cross-sectional view of a flange portion (a flange portion of a connecting portion of an upper casing and lower casing) of the fuel cell stack casing according to embodiment 5 of the present invention.
Figure 8:
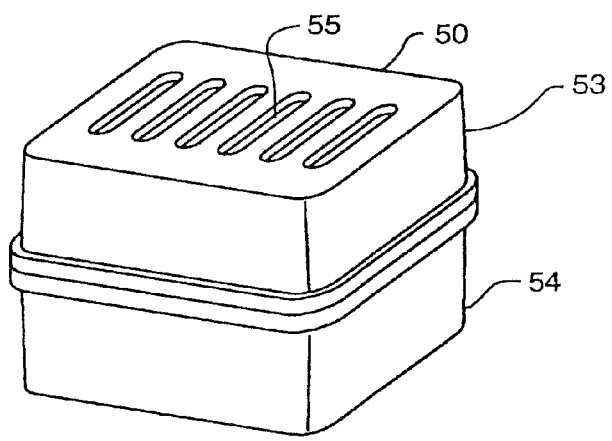
FIG. 8 is an oblique view of an external appearance of a fuel cell stack casing according to embodiment 6 of the present invention.
Figure 9:
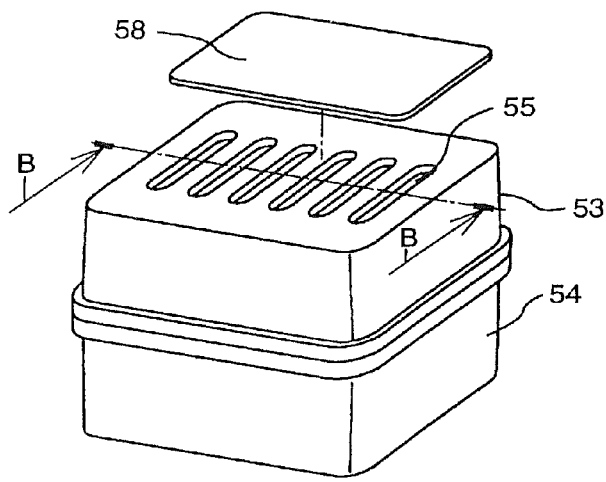
FIG. 9 is an oblique view of an external appearance of a fuel cell stack casing, just before a cover is coupled to the casing, according to embodiment 7 of the present invention.
Figure 10:
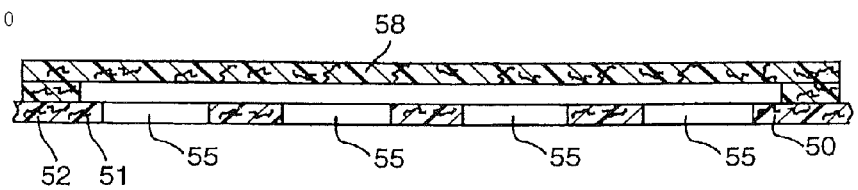
FIG. 10 is a cross-sectional view of an external appearance of a fuel cell stack casing, just after the cover is coupled to the casing, according to embodiment 7 of the present invention (a cross-sectional view taken along line B-B of FIG. 9)
Figure 11:
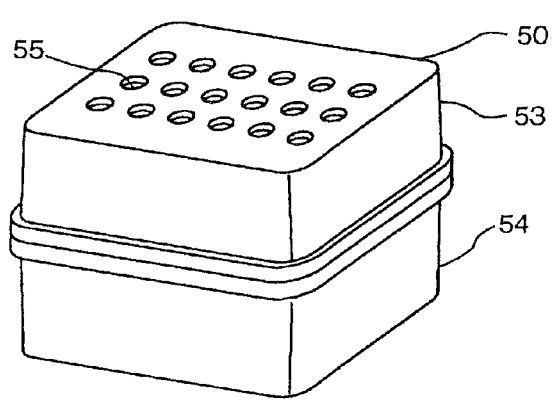
FIG. 11 is an oblique view of an external appearance of a fuel cell stack casing according to embodiment 8 of the present invention.
Figure 12:
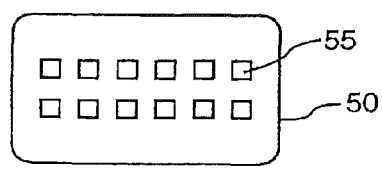
FIG. 12 is a plan view of a portion of a fuel cell stack casing according to embodiment 9 of the present invention for illustrating an arrangement of apertures.
Figure 13:
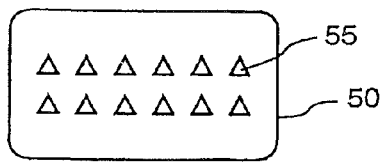
FIG. 13 is a plan view of a portion of a fuel cell stack casing according to embodiment 10 of the present invention for illustrating an arrangement of apertures.
Figure 14:
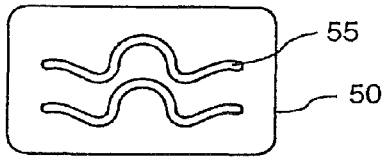
FIG. 14 is a plan view of a portion of a fuel cell stack casing according to embodiment 11 of the present invention for illustrating an arrangement of apertures.
Figure 15:
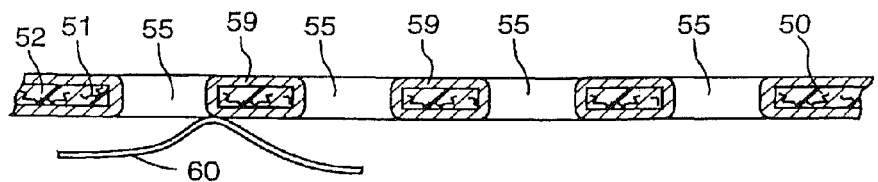
FIG. 15 is a plan view of a portion of a fuel cell stack casing according to embodiment 12 of the present invention for illustrating an arrangement of apertures.
Figure 16:
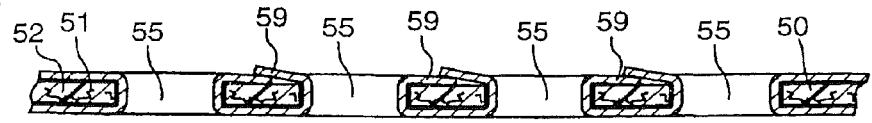
FIG. 16 is a plan view of a portion of a fuel cell stack casing according to embodiment 13 of the present invention for illustrating an arrangement of apertures.
Figure 17:
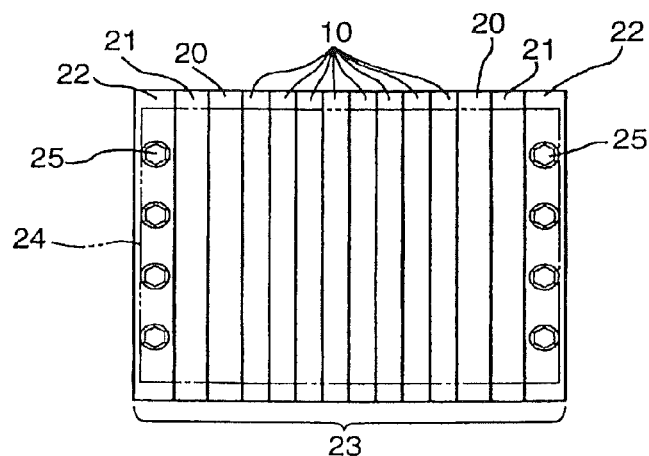
FIG. 17 is a side elevational view of a fuel cell stack housed in the fuel cell stack casing according to certain embodiments of the present invention.
Figure 18:
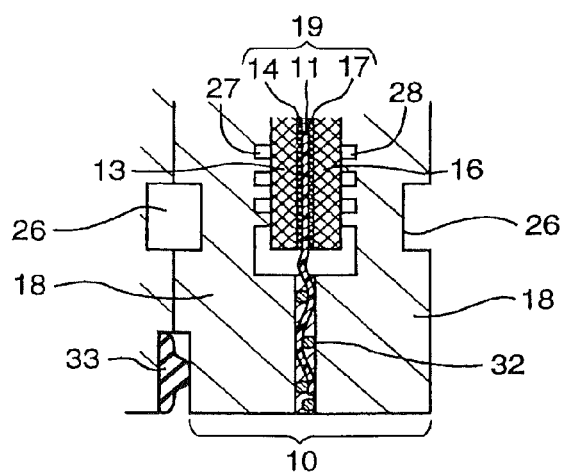
FIG. 18 is an enlarged cross-sectional view of a portion of FIG. 17.
Figure 19:
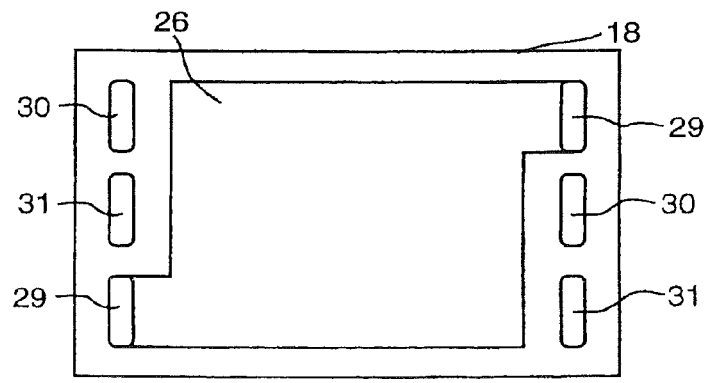
FIG. 19 is a front elavational view of a fuel cell stack at a separator portion of FIG. 17.

FIGS. 1, 2 and 17-19 can be applied to all embodiments of the present invention; FIG. 3 illustrates embodiment 1 of the present invention; FIG. 4 illustrates embodiment 2 of the present invention; FIG. 5 illustrates embodiment 3 of the present invention; FIG. 6 illustrates embodiment 4 of the present invention; FIG. 7 illustrates embodiment 5 of the present invention; FIG. 8 illustrates embodiment 6 of the present invention; FIGS. 9 and 10 illustrate embodiment 7 of the present invention; FIG. 11 illustrates embodiment 8 of the present invention; FIG. 12 illustrates embodiment 9 of the present invention; FIG. 13 illustrates embodiment 10 of the present invention; FIG. 14 illustrates embodiment 11 of the present invention; FIG. 15 illustrates embodiment 12 of the present invention; and, FIG. 16 illustrates embodiment 13 of the present invention.

Portions common to all embodiments of the present invention are denoted with the same reference numerals throughout the detailed description.

First, structures, effects and technical advantages common to all embodiments of the present invention will be explained with reference to FIGS. 1, 2 and 17-19.

A fuel cell stack casing 50 of certain embodiments of the present invention is a casing for housing a polymer electrolyte fuel cell 10. The fuel cell 10 is mounted to, for example, a vehicle. However, the fuel cell 10 may be used in an environment other than a vehicle.

As illustrated in FIGS. 1 and 17-19, the polymer electrolyte fuel cell 10 includes an MEA 19 (Membrane-Electrode Assembly) and a separator(s) 18 layered on the MEA.

The MEA 19 includes an electrolyte membrane 11 made from an ion exchange membrane, a first pole (an anode, fuel pole) 14 provided on one side of the membrane and including a first catalyst layer, and a second pole (a cathode, air pole) 17 provided on the other side of the membrane and including a second catalyst layer. Diffusion layers 13 and 16 may be disposed on an anode side and a cathode side, respectively, between the MEA and the separators 18.

The MEA 19 and the separators 18 layered on the MEA form a fuel cell 10. A number of fuel cells 10 are piled to form a pile of fuel cells, and an electrical terminal 20, an electrical insulator 21 and an end plate 22 are disposed at each of opposite ends of the pile of fuel cells. The end plates 22, at opposite ends of the pile of fuel cells, may be fixed to the fastening member (e.g., a tension plate 24) extending in the fuel cell stacking direction by bolts and nuts 25, and the pile of fuel cells are compressed in the fuel cell stacking direction, to construct a fuel cell stack 23.

In a power generating area of the separator 18, a fuel gas passage 27 for supplying fuel gas (e.g., hydrogen) to the anode 14 and an oxidant gas passage 28 for supplying oxidant gas (e.g., oxygen, usually, air) are formed. A coolant passage 26 for supplying coolant (e.g., water) also is formed in the separator 18. In a non-power generating area of the separator 18, a fuel gas manifold 30, an oxidant gas manifold 31 and a coolant manifold 29 are formed. The fuel gas manifold 30 communicates with the fuel gas passage 27, and the oxidant gas manifold 31 communicates with the oxidant gas passage 28. The coolant manifold 29 communicates with the coolant passage 26.

At the anode 14 of each fuel cell 19, hydrogen changes to positively charged hydrogen ions (i.e., protons) and electrons. The hydrogen ions move through the electrolyte membrane 11 to the cathode 17 where the hydrogen ions react with oxygen supplied and electrons (which are generated at an anode of the adjacent MEA and move to the cathode 17 of the instant MEA through a separator, or which are generated at an anode of a fuel cell located at a first end of the fuel cell stack and move to a cathode of a fuel cell located at a second, opposite end of the fuel cell stack through an external electrical circuit) to form water as follows:

At the anode:

$$H_2 \rightarrow 2H^+ + 2e^-$$

At the cathode:

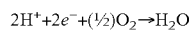

$$2H^+ + 2e^- + (1/2)O_2 \rightarrow H_2O$$

The fluids are sealed from each other and are sealed from open air. A space between the two separators 18, located on opposite sides of the MEA 19, of each fuel cell 10 is sealed by a first seal 3, and a space between the separators of adjacent fuel cells 10 is sealed by a second seal 33.

The first seal 32 is made from, for example, adhesive, and the second seal 33 is a gasket made from, for example, silicone rubber, fluoro-rubber, and EPDM (ethylene-propylene diene rubber, etc). However, it is contemplated by certain embodiments of the present invention that both the first seal 32 and the second seal 33 may be made from an adhesive or a gasket.

The separator 18 may be any one of a carbon separator, a metal separator, a combination of a metal separator and a resin frame, and an electrically conductive resin separator. Still other arrangements are possible.

The fuel cell stack 23 is housed in the fuel cell stack casing 50. A fuel cell voltage monitor terminal is connected to the fuel cell 10, and a wire harness from the fuel cell voltage monitor terminal extends from an interior of the fuel cell stack casing 50 to an exterior of the fuel cell stack casing 50 through an aperture formed in the fuel cell stack casing 50.

In order to prevent an electric current from flowing from the fuel cell 10 to the fuel cell stack casing 50, the fuel cell stack 23 and the fuel cell stack casing 50 are electrically insulated from each other, and the wire harness and the fuel cell stack casing 50 are electrically insulated from each other.

Figure 1:
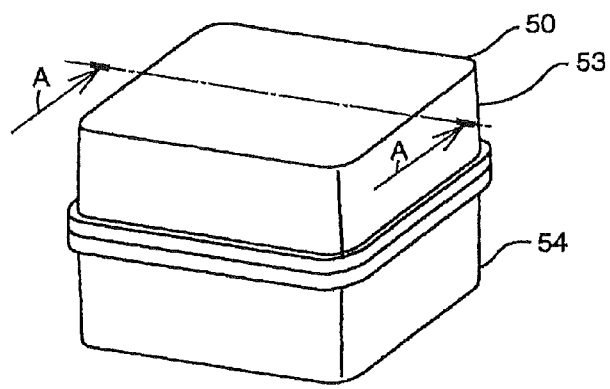
FIG. 1 is an oblique view of an external appearance of a fuel cell stack casing according to certain embodiments of the present invention.
Figure 2:
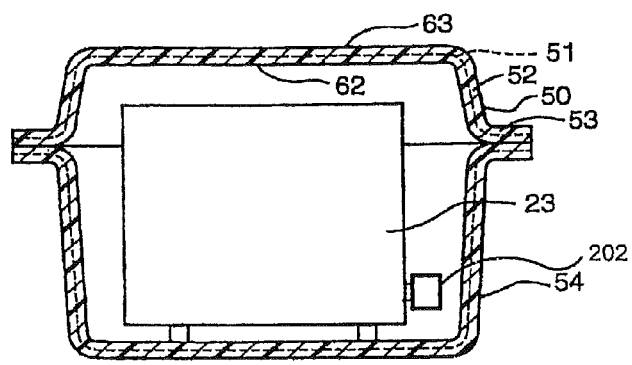
FIG. 2 is a cross-sectional view of the fuel cell stack casing according to certain embodiments of the present invention (a cross-sectional view taken along line A-A of FIG. 1)

As illustrated in FIGS. 1 and 2, the fuel cell stack casing 50 is a casing in which a fuel cell stack 23 is housed. The fuel cell stack casing 50 includes in a thickness of the casing (i.e., in the thickness of a wall of the casing) resin 52 and electromagnetic wave damping material (e.g., electrically conductive material 51). The fuel cell stack casing 50 is electromagnetically shielded by the conductive material 51 so that electromagnetic wave does not pass through the wall of the casing 50. The resin 52 of the wall of the fuel cell stack casing 50 is, for example, polyethylene, polypropylene, or carbon-fiber reinforced resin (C-FRR), etc.

As illustrated in FIGS. 1 and 2, the fuel cell stack casing 50 includes a plurality of (e.g., two or more) members (casings including, for example, an upper casing 53 and a lower casing 54) which are separated from each other so that the fuel cell stack 23 can be inserted into or taken out of the fuel cell stack casing 50. At least one of the casings 53 and 54 includes the conductive material 51 in the thickness of the wall. Preferably, all of the plurality of (two or more) members 53 and 54 separated from each other include the conductive material 51 in the thickness of the wall. The plurality of members 53 and 54 are coupled to each other such that the conductive materials 51 included in the plurality of members 53 and 54 are caused to be conductive to each other. These conductive materials 51 operate to decrease transmission of the electromagnetic wave from the interior of the fuel cell stack casing to the exterior of the fuel cell stack casing and from the exterior of the fuel cell stack casing to the interior of the fuel cell stack casing.

Preferably, the inside surface of the fuel cell stack casing 50 is an electrically insulated surface. In a case where the conductive material 51 of the fuel cell stack casing 50 is exposed to the interior of the casing, preferably, an electrically insulating material is disposed between the fuel cell stack 23 and the fuel cell stack casing 50.

As explained above, the fuel cell stack casing 50 includes the resin 52 and the conductive material 51. Both lightening and electromagnetic shielding can be satisfied by giving a difference in characteristics to the materials 51 and 52 in the following way.

The necessary abilities required for the fuel cell stack casing 50 include lightening, electromagnetic wave shield, strength, interception of water, and corrosion resistance, etc. To assure strength among the necessary abilities, thicknesses, material selection and a containing rate of the conductive material 51 and the resin material 52 are to be determined such that a strength in an in-plane direction of the casing 50 (e.g., a tensile strength) of the conductive material 51 is determined to be higher than a strength of the resin material 52. More particularly, by selecting a thickness of the resin material 52 greater than a thickness of the conductive material 51 so that a content of the conductive material 51 per a unit volume of the material of the fuel cell stack casing 50 is higher than a content of the resin 52 per the unit volume of the material of the fuel cell stack casing 50, a necessary strength is assured by the resin 52 as well as the electromagnetic shield is assured by the conductive material 51. A preferable resin which can be used is polyimide and polycarbonate.

From another point of view, when a material made from filament-formed conductive material having a fluid permeability (gas passability, water permeability) is used for the conductive material 51, it is desirable that a fluid non-permeability is given by the resin 52. In this instance, the resin 52 may be provided so as to fill clearances between the conductive materials 51, or a layer of the conductive material 51 and a resin sheet having a fluid non-permeability may be layered. For the resin, polyimide, polycarbonate, polyurethane and polypropylene, etc, can be desirably used. According to the structure, by decreasing a density of the conductive material, lightening is obtained, maintaining the ability of preventing water such as rain from entering the interior of the fuel cell stack casing 50. Particularly, in a case where the fuel cell stack casing 50 houses a fuel cell stack 23 having an exposed conductive separator, water is prevented from adhering to the fuel cell stack so as to bridge separators having different electric potentials.

From the viewpoint of corrosion resistance, by using a resin having a higher acid resistance and corrosion resistance than the conductive material 51 for the resin material 52, a fuel cell stack casing 50 having a high corrosion resistance can be provided.

Next, effects and technical advantages due to the above-described structures common to all embodiments of the present invention will be explained.

Since the fuel cell stack casing 50 includes the resin 52 and the conductive material 51, the fuel cell stack casing 50 can be lightened compared with a case where an entire portion of the fuel cell stack casing is made from metal such as iron or aluminum. Further, since the fuel cell stack casing 50 includes resin, formability of the casing is improved by injection-molding the casing, because a problem of under-cut caused in stamping (a problem that insertion of a die into an under cut portion is impossible and therefore, stamping the under cut portion is difficult) does not occur. Further, due to the shield by the conductive material 51, the fuel cell stack casing 50 has an electromagnetic shield (an electromagnetic isolation ability).

Since the fuel cell stack casing 50 includes the plurality of members 53 and 54 (for example, the upper casing 53 and the lower casing 54 of the embodiment), and the plurality of members 53 and 54 are coupled to each other such that the conductive materials 51 included in the plurality of members 53 and 54 are caused to be conductive to each other, the electromagnetic wave may be prevented from leaking at a coupling portion of the plurality of the members 53 and 54. As a result, a device whose operation is controlled by electromagnetic force and electromagnetic wave, such as a relay 202 shown in FIG. 2 is prevented from causing an error in operation.

In the case where the inside surface 62 of the fuel cell stack casing 50 is an electrically insulated surface, the casing 50 can be electrically insulated from the high-voltage parts (fuel cell stack 23) housed in the casing 50 so that contact with the casing 50 is safe.

Next, structures, effects and technical advantages unique to each embodiment of the present invention will be explained.

Embodiment 1

FIG. 3

In embodiment 1, as illustrated in FIG. 3, resinification of the fuel cell stack casing 50 is performed by causing the resin (for example, polyethylene) to contain conductive material 51 (for example, an aluminum filler, a graphite filler of a schuppen structure, etc.) The conductive materials 51 exist at random in the resin 52 and contact with each other to be electrically connected to each other. In a case where a part of conductive materials 51 is exposed to the inside surface 62 of the casing 50, an electrical insulator is desired to be provided between the fuel cell stack casing 50 and the fuel cell stack 23.

In other words, plural conductive elements having conductivity exist in parts of the fuel cell stack casing 50 (for example, the upper casing 53 and the lower casing 54) such that the plural conductive elements contact with each other and in a substantially planar state. These conductive elements are, for example, fibers, sphericals, or particles and are sufficiently small compared with the fuel cell stack casing 50. Since the plural conductive elements contact with each other, a conductive net having conductivity is formed along a plane of the fuel cell stack casing 50. An electromagnetic shield is given to the fuel cell stack casing 50 by the conductive net.

With effects and technical advantages of embodiment 1 of the present invention, since resinification of the fuel cell stack casing 50 is performed by causing the resin 52 to contain the conductive fillers 51 which contact with each other, an electromagnetic shield is formed over the entire plane of the wall of the casing. Further, since a part of the conductive material 51 is exposed to the inside surface 62 of the casing 50 also, the inside and outside surfaces of the casing 50 are conductive surfaces when the casing 50 is manufactured. As a result, only by coupling the upper casing 53 and the lower casing 54, an electromagnetic shield of a coupling portion of the upper casing 53 and the lower casing 54 is assured.

If conductive fibers such as, for example, carbon fibers are used for the conductive material 51 and the fibers are entangled to each other or are arranged, the fibers desirably operate to reinforce the resin layer.

Embodiment 2

FIG. 4

In embodiment 2, as illustrated in FIG. 4, resinification of the fuel cell stack casing 50 is performed by sandwiching a conductive layer 51 (for example, an aluminum thin plate, a graphite plate of a schuppen structure, etc., the same hereinafter) between two layers made from a non-conductive resin 52 (for example, polyethylene). The conductive layer 51 is not exposed to inside and outside surfaces of the casing 50.

With effects and technical advantages of embodiment 2 of the present invention, since during resinification of the fuel cell stack casing 50 the conductive layer 51 is performed between two layers made from a non-conductive resin 52, an electromagnetic shield can be formed over the entire plane of the wall of the casing. Since the conductive layer 51 is not exposed to the inside surface of the casing 50, there is no need to provide an electric insulator between the fuel cell stack 23 and the casing 50. Further, an electromagnetic shield of the coupling portion of the upper casing 53 and the lower casing 54 can be assured by setting a pitch between bolts connecting the casings 53 and 54 smaller than a certain pitch at which leakage of electromagnetic waves can be prevented as illustrated in FIG. 7. The structure of FIG. 7 may be replaced by a structure of FIG. 6.

In the embodiment, the conductive material 51 is not limited to a continuous conductive sheet. More particularly, the electromagnetic shield may be formed by a metal mesh such as a net having apertures in a thickness direction. By this structure, further lightening can be obtained.

Embodiment 3

FIG. 5

In embodiment 3, as illustrated in FIG. 5, resinification of the fuel cell stack casing 50 is performed by layering a layer made from a non-conductive resin 52 (for example, polyethylene) and a layer of conductive material 51 (for example, an aluminum thin plate, a graphite plate of a schuppen structure, etc., the same hereinafter) provided on an outside surface 63 side of the casing (or on an inside surface 62 side of the casing, and in a case where the conductive material layer is provided on the inside surface side of the casing, an electric insulator is required to be provided on the inner side of the conducting material layer). The conductive surface 51 provided on the outside surface of the casing may be made by adhering an aluminum leaf on the casing. The conductive layer 51 is not exposed to the inside surface of the casing 50.

With effects and technical advantages of embodiment 3 of the present invention, since during resinification of the fuel cell stack casing 50 the conductive layer 51 is provided at the outside surface of the casing 50, an electromagnetic shield can be formed over the entire plane of the wall of the casing. Since the conductive layer 51 is not exposed to the inside surface 62 of the casing 50, there is no need to provide an electric insulator between the fuel cell stack 23 and the casing 50. Further, an electromagnetic shield of the coupling portion of the upper casing 53 and the lower casing 54 can be assured by setting a pitch between bolts connecting the casings 53 and 54 smaller than a certain pitch at which leakage of electromagnetic waves can be prevented as illustrated in FIG. 7. The structure of FIG. 7 may be replaced by a structure of FIG. 6.

Embodiment 4

FIG. 6

In embodiment 4, as illustrated in FIG. 6, formation of an electromagnetic shield between plural members 53 and 54 (for example, the upper casing 53 and the lower casing 54) is performed by disposing the conductive materials 56 in an exposed manner at opposing flanges of the plural member3 53 and 54 over entire circumferences of the flanges so that the opposing conductive materials 56 are brought into contact with each other when the plural casings 53 and 54 are fastened. At an entire plane of the plural members 53 and 54, the conductive material 51 is provided. The structure of FIG. 6 may be replaced by one of the structures of FIGS. 3-5.

With effects and technical advantages of embodiment 4 of the present invention, since the conductive material 56 is provided at the entire circumference at the opposing flanges of the plural members 53 and 54, both a conductivity and an electromagnetic shield can be assured over the entire circumference of the flanges of the casing 50. Since the conductive material 51 is provided at the entire plane of the casing except the flanges, an electromagnetic shield can be assured at the entire plane of the casing. Electric contact by the conductive material 51 may be replaced by electric contact by the fastening member (e.g., a bolt) extending through the members 53 and 54 and fastening the members 53 and 54.

Embodiment 5

FIG. 7

In embodiment 5, as illustrated in FIG. 7, formation of an electromagnetic shield between plural members 53 and 54 (for example, the upper casing 53 and the lower casing 54) is performed by fastening the members 53 and 54 by bolts 57 which are made from conductive material (nuts 61 are embedded in the flange of the lower casing) and are spaced from each other at a pitch smaller than a certain pitch (a pitch capable of preventing leakage of electromagnetic waves, for example 100 mm). At an entire plane of the plural members 53 and 54, the conductive material 51 is provided. The structure of FIG. 6 may be replaced by one of the structures of FIGS. 3-5.

With effects and technical advantages of embodiment 5 of the present invention, since the bolts 57 are provided at a pitch smaller than the certain pitch at the opposing flanges of the plural members 53 and 54, an electromagnetic shield can be assured over the entire circumference of the flanges of the casing 50. Since the conductive material 51 is provided at the entire plane of the casing except the flanges, an electromagnetic shield can be assured at the entire plane of the casing.

Embodiment 6

FIG. 8

In embodiment 6, as illustrated in FIG. 8, plural apertures 55 for ventilation are formed in the wall of the fuel cell stack casing 50 such that the apertures are spaced from each other. The aperture is an aperture for ventilating a very small amount of hydrogen which may leak from a fuel gas circuit. Preferably, the apertures are located at a ceiling of the casing 50 so as to ventilate hydrogen which is lighter than air. The apertures can be located at a portion of the casing other than the ceiling. A resin coating is formed at a hem of the aperture so that an edge (an edge having a right angle) of the hem of the aperture is not exposed.

In the example of FIG. 8, the apertures 55 are slits parallel to each other so that a decrease in a rigidity of the casing is suppressed. A portion of the casing located between the apertures contains the conductive materials 51. In order to prevent and/or limit electromagnetic waves from leaking through the apertures, it may be desirable to make an area of the aperture 55 to be equal to or less than an area of an aperture having a diameter of 40 mm.

With respect to effects and technical advantages of embodiment 6 of the present invention, since the plural ventilation apertures 55 are formed in the wall of the fuel cell stack casing 50 such that the apertures 55 are spaced from each other, even if a very small amount of hydrogen leaks from the fuel cell stack, the hydrogen can be ventilated from the interior of the casing 50. Further, since the plural apertures are spaced from each other, electromagnetic waves are prevented from leaking through the apertures unlike a case where a single large aperture is provided. Accordingly, an electromagnetic shield can be maintained.

Embodiment 7

FIGS. 9 and 10

In embodiment 7, as illustrated in FIGS. 9 and 10, plural apertures 55 for ventilation are formed in the wall of the fuel cell stack casing 50 such that the apertures are spaced from each other. The aperture is an aperture for ventilating a very small amount of hydrogen which may leak from a fuel gas circuit. Preferably, the apertures are located at a ceiling of the casing 50 so as to ventilate hydrogen which is lighter than air. The apertures can be located at a portion of the casing other than the ceiling. Further, the plural apertures are covered with a cover 58 made from a material (for example, a material named "GOATEX") which allows air to pass therethrough and does not allow water to pass therethrough. In a case where a size of the aperture is so small that electromagnetic waves do not pass through the aperture, the cover 58 is not required to contain conductive materials so that the cover 58 is not given an electromagnetic shielding ability. In contrast, in a case where a size of the aperture is so large that electromagnetic waves pass through the aperture, the cover 58 is required to contain conductive materials so that the cover 58 is given an electromagnetic shielding ability. When the cover 58 is given the electromagnetic shielding ability, the cover 58 and the casing 50 are caused to be conductive to each other.

With respect to effects and technical advantages of embodiment 7 of the present invention, since the plural ventilation apertures 55 are formed in the wall of the fuel cell stack casing 50 such that the apertures 55 are spaced from each other, even if a very small amount of hydrogen leaks from the fuel cell stack, the hydrogen can be ventilated from the interior of the casing 50. Further, since the plural apertures are spaced from each other, electromagnetic waves are prevented from leaking through the apertures unlike a case where a single large aperture is provided. Accordingly, an electromagnetic shield can be maintained. Further, since all of the apertures 55 are covered with the cover 58 made from a material which allows air to pass therethrough and does not allow water to pass therethrough, water can be prevented from entering the interior of the casing from outside of the casing. Further, in the case where the cover 58 contains conductive materials and is given an electromagnetic shielding ability, the size of the aperture 55 may be so large that electromagnetic waves can pass through the aperture. In such a case, the electromagnetic shield can be assured by the cover 58.

Embodiment 8

FIG. 11

In embodiment 8, as illustrated in FIG. 11, plural apertures 55 for ventilation are formed in the wall of the fuel cell stack casing 50 such that the apertures are spaced from each other. The aperture is an aperture for ventilating a very small amount of hydrogen which may leak from a fuel gas circuit. Preferably, the apertures are located at a ceiling of the casing 50 so as to ventilate hydrogen which is lighter than air. The aperture 55 is an aperture having a shape other than a slit. The aperture 55 is, for example, a circular aperture. The apertures 55 may be regularly arranged, for example, in a lattice or may be arranged at random.

With respect to effects and technical advantages of embodiment 8 of the present invention, since the plural ventilation apertures 55 are formed in the wall of the fuel cell stack casing 50 such that the apertures 55 are spaced from each other, even if a very small amount of hydrogen leaks from the fuel cell stack, the hydrogen can be ventilated from the interior of the casing 50. Further, since each of the plural apertures 55 is an aperture having a shape other than a slit, an electromagnetic shield can be easily maintained in all directions, compared with a case where an aperture is made from a slit and therefore an electromagnetic shield can be difficult to maintain in a longitudinal direction of the slit.

Embodiment 9

FIG. 12

In embodiment 9, as illustrated in FIG. 12, plural apertures 55 for ventilation are formed in the wall of the fuel cell stack casing 50 such that the apertures are spaced from each other. The aperture is an aperture for ventilating a very small amount of hydrogen which may leak from a fuel gas circuit. Preferably, the apertures are located at a ceiling of the casing 50 so as to ventilate hydrogen which is lighter than air. The aperture 55 is an aperture having a shape other than a slit. The aperture 55 is, for example, a four-cornered aperture (e.g., a square, a rectangle, and a lozenge, etc.) The apertures 55 may be regularly arranged, for example, in a lattice or may be arranged at random.

With respect to effects and technical advantages of embodiment 9 of the present invention, since the plural ventilation apertures 55 are formed in the wall of the fuel cell stack casing 50 such that the apertures 55 are spaced from each other, even if a very small amount of hydrogen leaks from the fuel cell stack, the hydrogen can be ventilated from the interior of the casing 50. Further, since each of the plural apertures 55 is an aperture having a shape other than a slit, an electromagnetic shield can be easily maintained in all directions, compared with a case where an aperture is made from a slit and therefore an electromagnetic shield difficult in a longitudinal direction of the slit.

Embodiment 10

FIG. 13

In embodiment 10, as illustrated in FIG. 13, plural apertures 55 for ventilation are formed in the wall of the fuel cell stack casing 50 such that the apertures are spaced from each other. The aperture is an aperture for ventilating a very small amount of hydrogen which may leak from a fuel gas circuit. Preferably, the apertures are located at a ceiling of the casing 50 so as to ventilate hydrogen which is lighter than air. The aperture 55 is an aperture having a shape other than a slit. The aperture 55 is, for example, a triangular aperture. The apertures 55 may be regularly arranged, for example, in a lattice or may be arranged at random.

With respect to effects and technical advantages of embodiment 10 of the present invention, since the plural ventilation apertures 55 are formed in the wall of the fuel cell stack casing 50 such that the apertures 55 are spaced from each other, even if a very small amount of hydrogen leaks from the fuel cell stack, the hydrogen can be ventilated from the interior of the casing 50. Further, since each of the plural apertures 55 is an aperture having a shape other than a slit, an electromagnetic shield can be easily maintained in all directions, compared with a case where an aperture is made from a slit and therefore an electromagnetic shield may be difficult to maintain in a longitudinal direction of the slit.

Embodiment 11

FIG. 14

In embodiment 11, as illustrated in FIG. 14, plural apertures 55 for ventilation are formed in the wall of the fuel cell stack casing 50 such that the apertures are spaced from each other. The aperture is an aperture for ventilating a very small amount of hydrogen which may leak from a fuel gas circuit. Preferably, the apertures are located at a ceiling of the casing 50 so as to ventilate hydrogen which is lighter than air. The aperture 55 is an aperture having a shape other than a slit. The aperture 55 is, for example, an aperture having an arbitral shape other than a slit. The apertures 55 may be regularly arranged, for example, in a lattice or may be arranged at random.

With respect to effects and technical advantages of embodiment 11 of the present invention, since the plural ventilation apertures 55 are formed in the wall of the fuel cell stack casing 50 such that the apertures 55 are spaced from each other, even if a very small amount of hydrogen leaks from the fuel cell stack, the hydrogen can be ventilated from the interior of the casing 50. Further, since each of the plural apertures 55 is an aperture having an arbitral shape other than a slit, an electromagnetic shield can be easily maintained in all directions, compared with a case where an aperture is made from a slit and therefore an electromagnetic shield may be difficult to maintain in a longitudinal direction of the slit.

Embodiment 12

FIG. 15

In embodiment 12, as illustrated in FIG. 15, plural apertures 55 for ventilation are formed in the wall of the fuel cell stack casing 50 such that the apertures are spaced from each other. The aperture is an aperture for ventilating a very small amount of hydrogen which may leak from a fuel gas circuit. Preferably, the apertures are located at a ceiling of the casing 50 so as to ventilate hydrogen which is lighter than air. A hem of the aperture 55 is coated with a coating 59 (for example, a resin coating, and the resin is, for example, polyethylene) so that exposure to an edge of the hem of the aperture can be limited and/or prevented.

With respect to effects and technical advantages of embodiment 12 of the present invention, since the hem of the aperture 55 is coated with the coating 59 (for example, the resin coating) so that the exposure to the edge of the hem of the aperture can be limited and/or prevented, even if a wire harness 60 contacts the hem of the aperture many times (due to vibration of a vehicle), injury to the wire harness 60 can be limited and/or prevented. If the coating 59 is not formed, a wire harness may contact the edge of the hem of the aperture, thus damaging the edge, or, may be exposed outside to be conductive to the casing. However, in the present invention, such instances can be limited and/or prevented.

Embodiment 13

FIG. 16

In embodiment 13, as illustrated in FIG. 16, plural apertures 55 for ventilation are formed in the wall of the fuel cell stack casing 50 such that the apertures are spaced from each other. The aperture is an aperture for ventilating a very small amount of hydrogen which may leak from a fuel gas circuit. Preferably, the apertures are located at a ceiling of the casing 50 so as to ventilate hydrogen which is lighter than air. A hem of the aperture 55 is covered with a covering layer 59 (for example, a tape) so that an edge of the hem of the aperture 55 is not exposed.

With respect to effects and technical advantages of embodiment 13 of the present invention, since the hem of the aperture 55 is covered with the covering layer 59 (for example, the tape) so that the edge of the hem of the aperture is not exposed, even if a wire harness 60 contacts the hem of the aperture many times (due to vibration of a vehicle), damage to the wire harness 60 can be limited and/or prevented. If the covering layer 59 is not formed, the wire harness may contact the edge of the hem of the aperture to be injured and may be exposed outside to be conductive to the casing. However, in the present invention, such instances can be limited and/or prevented.

[Alterations]

Though the fuel cell stack casing 50 is electromagnetically shielded by a plane of the conductive material located along a plane of the casing in the above-described embodiments, the present invention is not limited to the above-described embodiments.

More particularly, an electromagnetic wave absorbing material such as ferrite may be used. In the structure, electromagnetic waves may be dampened by a loss of permeability of a magnetic material. For this kind of electromagnetic wave absorbing material, a magnetic material in the form of powder mixed with resin and integrally formed can be used. The magnetic material operates with a magnetic field component of an electromagnetic wave and changes an energy to heat.

Though the conductive material is provided in the form of a continuous plane in the above-described embodiments, the conductive material is not necessarily provided in the form of plane. More particularly, conductive particles such as carbon particles may be arranged in the resin such as the particles are spaced from each other, so long as the conductive particles operate the electric field component of the electromagnetic wave to change the energy to heat. As other materials, a material for reflecting electromagnetic waves also can be used for the electromagnetic damping material.

Any material can be used for the electromagnetic damping material, so long as the material has a stronger electromagnetic wave damping ability than resin.

In a case where the electromagnetic wave damping material damps the electromagnetic wave by changing the electromagnetic wave to an electric energy (for example, in a case where the fuel cell stack casing is covered by a plane of a conductive material), it is desirable that the plane of conductive material is earthed in order to quickly remove an electric charge from the fuel cell stack casing. In a case where the fuel cell 10 and the fuel cell stack casing 50 are installed to a vehicle and operates as a motor for supplying an electric power to a drive motor of the vehicle, the conductive plane of the fuel cell stack casing 50 is desirably earthed to a body of the vehicle. The conductive plane of the fuel cell stack casing 50 includes not only the electric plane (the conductive material 51) formed in a sheet as explained in embodiment 2 but also the electric plane made from the conductive elements entangled with each other and mixed in the resin as explained in embodiment 1.

The examples described herein are merely illustrative, as numerous other embodiments may be implemented without departing from the spirit and scope of the exemplary embodiments of the present invention. Moreover, while certain features of the invention may be shown on only certain embodiments or configurations, these features may be exchanged, added, and removed from and between the various embodiments or configurations while remaining within the scope of the invention. Likewise, methods described and disclosed may also be performed in various sequences, with some or all of the disclosed steps being performed in a different order than described while still remaining within the spirit and scope of the present invention.

The invention claimed is:

1. A fuel cell stack casing housing a fuel cell, wherein said fuel cell stack casing includes a resin and an electromagnetic wave damping material for damping an electromagnetic wave, said electromagnetic material being conductive materials having a form of fillers or fibers, said conductive materials included in said resin existing at random in said resin and contact each other to be electrically connected to each other such that an electromagnetic shield is formed over an entire plane of a wall of the fuel cell stack casing, wherein a wall of said fuel cell stack casing includes a plurality of apertures for ventilating hydrogen which are spaced from each other, each of the plurality of apertures being open to an environment outside the casing, each of said plurality of apertures for ventilating hydrogen having a size smaller than a size at or up to which the electromagnetic shield for an entire plane of the fuel cell stack casing is maintained, said plurality of apertures for ventilating hydrogen being located at a ceiling of the fuel cell stack casing, a portion of the casing located between the apertures containing the resin and the conductive materials, an area of each of the apertures being equal to or less than an area of an aperture having an equivalent diameter of 40 mm in order to prevent or limit electromagnetic waves from leaking through the plurality of apertures, and wherein said fuel cell stack casing includes a plurality of members, said plurality of members being coupled to each other by a coupling structure such that said conductive materials included in said plurality of members are caused to be conductive to each other and an electromagnetic wave does not leak at a coupling portion of said plurality of members, said fuel cell casing including an upper casing and a lower casing, the upper casing and the lower casing including opposing flanges opposing each other, the upper casing and the lower casing being fastened to each other at the opposing flanges by conductive bolts which are spaced from each other at a pitch smaller than 100 mm so that electromagnetic waves is prevented from leaking between the conductive bolts.

2. A fuel cell stack casing according to claim 1, wherein said fuel cell stack casing includes an insulated inside surface.

3. A fuel cell stack casing according to claim 1, wherein each of said apertures formed in the wall of said fuel cell stack casing has a grommet coupled to a hem of the aperture, said grommet being made from either one of resin or rubber.

4. A fuel cell stack casing according to claim 1, wherein said plurality of apertures are covered by a cover made from a material which allows air to pass therethrough and does not allow water to pass therethrough.

* * * * *